US009099977B2

(12) United States Patent
Oishi

(10) Patent No.: US 9,099,977 B2
(45) Date of Patent: Aug. 4, 2015

(54) AMPLIFIER CIRCUIT

(71) Applicant: FUJITSU LIMITED, Kawasaki-shi, Kanagawa (JP)

(72) Inventor: Kazuaki Oishi, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/551,501

(22) Filed: Nov. 24, 2014

(65) Prior Publication Data
US 2015/0077184 A1 Mar. 19, 2015

Related U.S. Application Data

(63) Continuation of application No. PCT/JP2012/065049, filed on Jun. 12, 2012.

(51) Int. Cl.
*H03G 3/20* (2006.01)
*H03G 3/30* (2006.01)
*H03F 1/02* (2006.01)
*H03F 1/32* (2006.01)
*H03F 3/24* (2006.01)
*H03F 3/193* (2006.01)
*H03F 3/21* (2006.01)
*H03F 3/19* (2006.01)

(52) U.S. Cl.
CPC ........... *H03G 3/3042* (2013.01); *H03F 1/0227* (2013.01); *H03F 1/3241* (2013.01); *H03F 3/19* (2013.01); *H03F 3/193* (2013.01); *H03F 3/21* (2013.01); *H03F 3/24* (2013.01); *H03F 2200/165* (2013.01); *H03F 2200/451* (2013.01)

(58) Field of Classification Search
USPC .................. 330/136, 127, 297, 279
See application file for complete search history.

(56) References Cited

U.S. PATENT DOCUMENTS

| 5,251,330 A | 10/1993 | Chiba et al. |
| 8,686,792 B2* | 4/2014 | Sukegawa et al. ............ 330/136 |
| 2006/0057976 A1 | 3/2006 | Klemmer |

FOREIGN PATENT DOCUMENTS

| JP | 3-104422 | 5/1991 |
| JP | 2002-353744 | 12/2002 |

(Continued)

OTHER PUBLICATIONS

Written Opinion of the International Searching Authority and International Search Report (Form PCT/ISA/210 and Form PCT/ISA/237), mailed in connection with PCT/JP2012/065049 and mailed Sep. 11, 2012 (partial English Translation).

*Primary Examiner* — Hieu Nguyen
(74) *Attorney, Agent, or Firm* — Fujitsu Patent Center

(57) ABSTRACT

An amplifier circuit includes: a first filter that receives input of amplitude information of an input signal, and performs filtering so that a gain of a frequency component higher than a first cutoff frequency becomes greater than a gain of a frequency component lower than the first cutoff frequency; a power supply circuit that has a low-pass filter characteristic, and receives input of amplitude information outputted from the first filter and generates a power supply voltage corresponding to the amplitude information outputted from the first filter; an amplifier that receives supply of the power supply voltage, and amplifies a signal based on the input signal; and a phase difference detector that detects a phase difference between the amplitude information of the input signal and the power supply voltage, wherein the first filter changes the first cutoff frequency in a direction in which the phase difference decreases.

8 Claims, 14 Drawing Sheets

(56) References Cited

FOREIGN PATENT DOCUMENTS

| JP | 2008-514044 | 5/2008 |
| JP | 2009-232296 | 10/2009 |
| JP | 2011-211533 | 10/2011 |

* cited by examiner

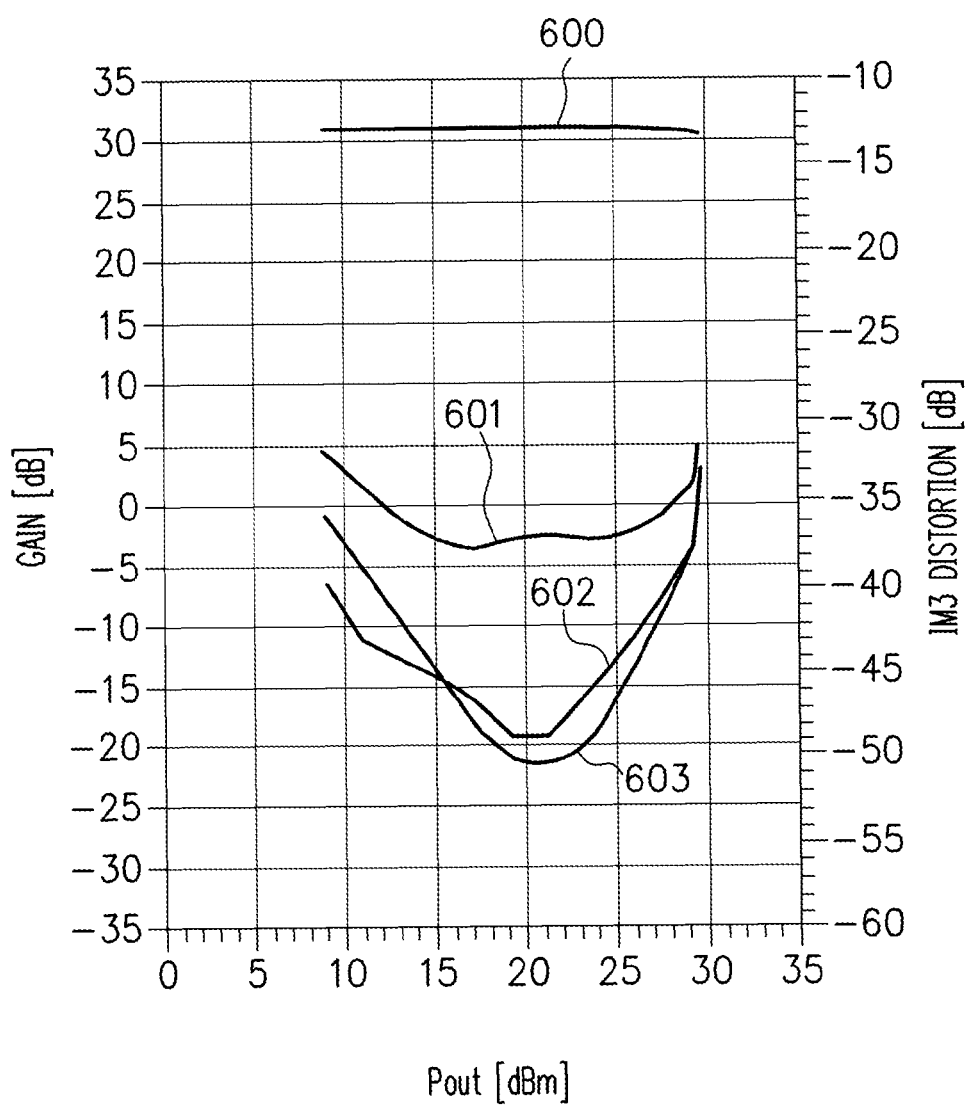
F I G. 5

F I G. 6
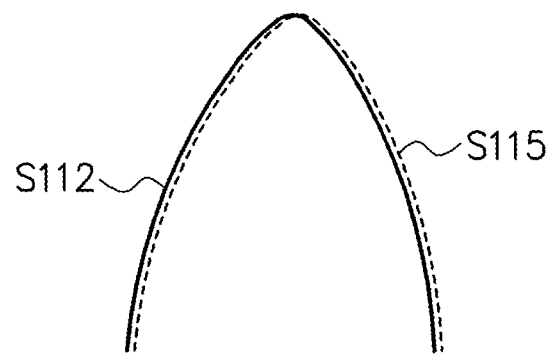
F I G. 7A
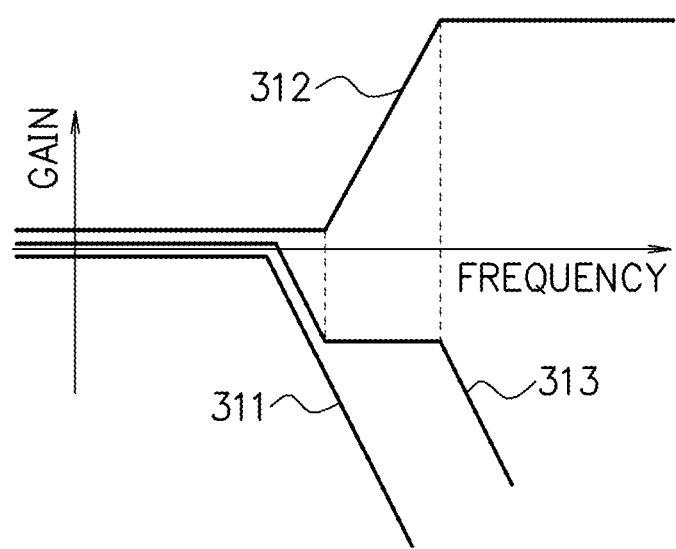

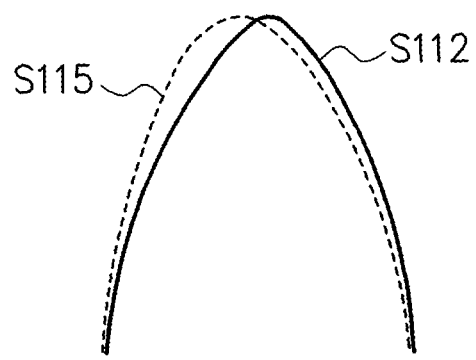
F I G. 8B

F I G. 14
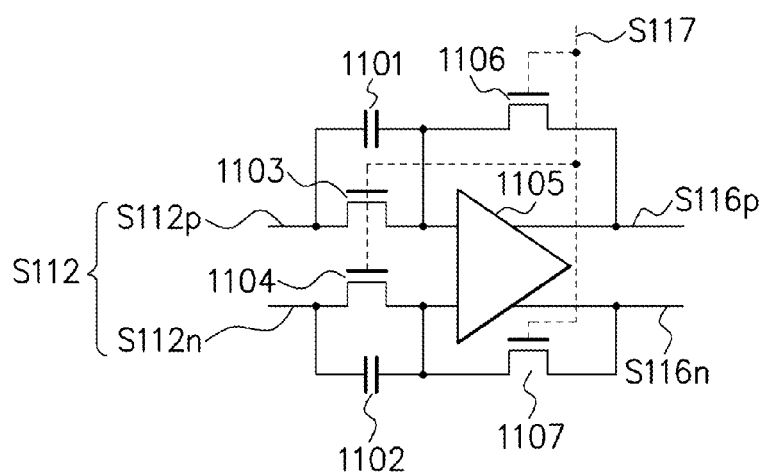
F I G. 15A
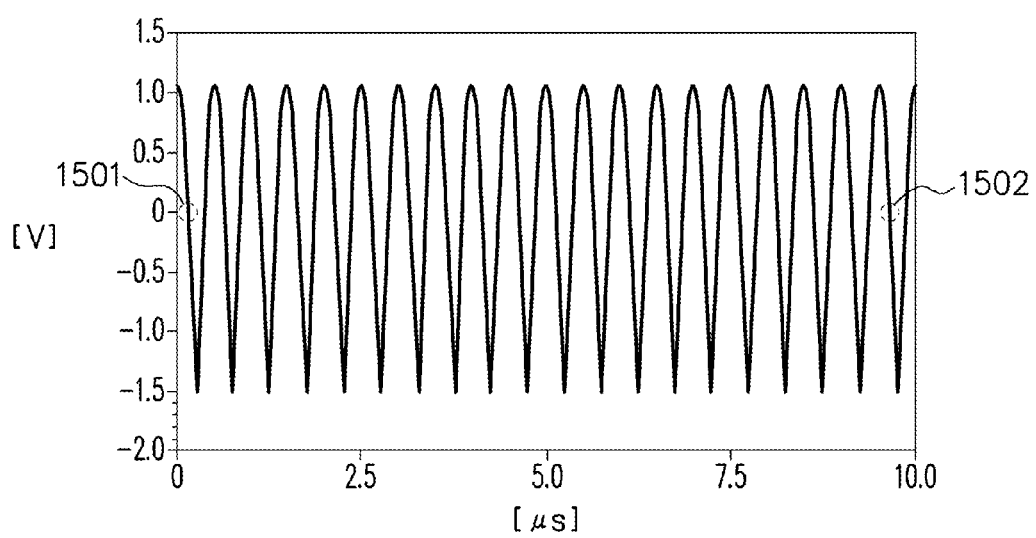

F I G. 15B
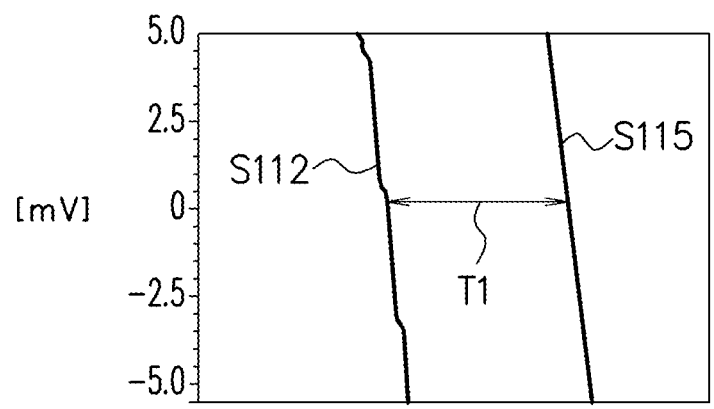
F I G. 15C
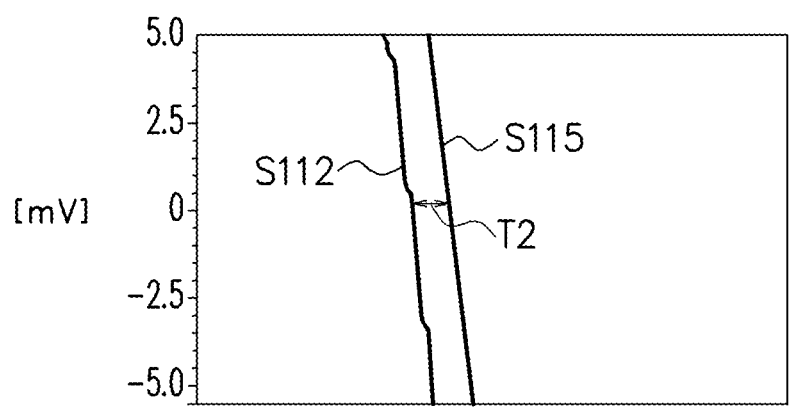

F I G. 16
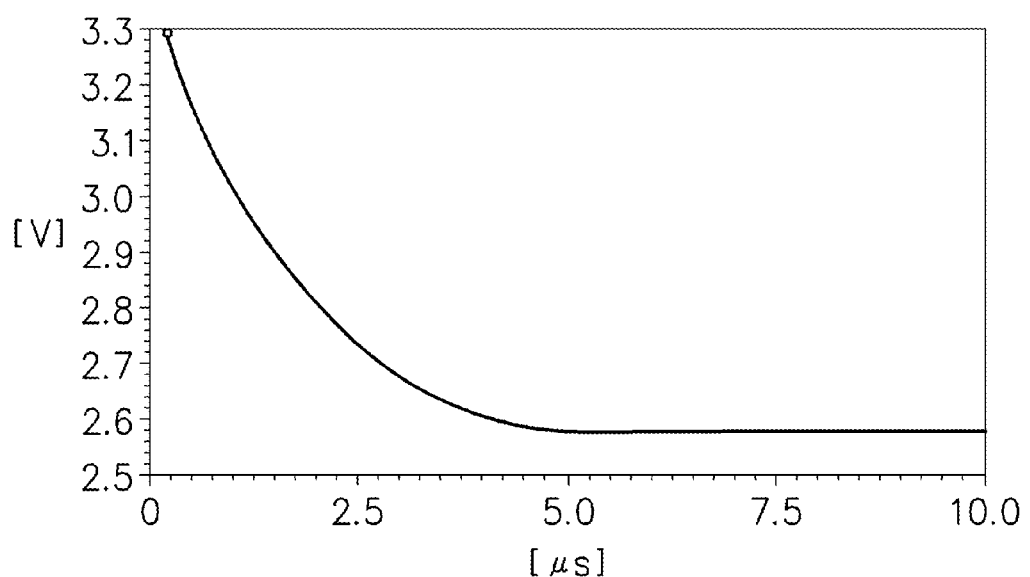

AMPLIFIER CIRCUIT

CROSS-REFERENCE TO RELATED APPLICATION

This application is a continuation application of International Application PCT/JP2012/065049 filed on Jun. 12, 2012 and designated the U.S., the entire contents of which are incorporated herein by reference.

FIELD

The embodiments discussed herein are directed to an amplifier circuit.

BACKGROUND

For a transmitter of radio communication, a power amplifier is used to transmit radio waves in air. The power amplifier needs to output a signal of large power and is thus a block consuming large power in the transmitter. Therefore, it is important to increase the power efficiency of the power amplifier to decrease the power consumption.

There is a known amplifier circuit which includes a function of applying a power supply voltage modulated based on an input signal to an amplifier to the amplifier, a function of estimating an inverse distortion characteristic on the basis of input/output characteristics of the amplifier and performing distortion compensation, and a function of adjusting mutual timings of the input signal and the power supply voltage applied to the amplifier, in which in a state that the distortion compensation by a distortion compensating unit is not performed, an output of the amplifier is increased by timing adjustment from an output whose timing has not been adjusted at the time when an adjustment signal having a peaked waveform is inputted into the amplifier so as to cause a peak value to appear, and timing adjustment is performed so that a value corresponding to the width (gain width or the like) of the input/output characteristics at an output near the peak value and lower than the peak value becomes a predetermined value (ideally, 0) (refer to, for example, Patent Document 1).

There also is a known amplifier circuit which includes an amplifier, a power supply modulation circuit that applies a power supply voltage modulated based on an input signal to the amplifier, and a distortion compensation circuit that is placed ahead of the amplifier and generates an inverse distortion characteristic cancelling a distortion characteristic of the amplifier and adds the inverse distortion characteristic to the input signal, in which a gain adjusting circuit is provided between the distortion compensation circuit and the amplifier, and an inverse characteristic shaping a frequency characteristic of the amplifier irrespective of the power supply voltage is a frequency characteristic of the gain adjusting circuit (refer to, for example, Patent Document 2).

Further, there is a distortion compensation amplifier which includes an amplifier circuit that may include a distortion component in an amplified output signal, a first detection means that detects the amplitude of an input signal, a second detection manes that detects the amplitude of the output signal, and an amplitude control means that is inserted and connected to the previous stage of the amplifier circuit and controls the amplitude of a signal introduced into the amplifier circuit so that the difference or ratio between the amplitudes detected by the first detection means and the second detection means converges (refer to, for example, Patent Document 3).

Patent Document 1: Japanese Laid-open Patent Publication No. 2009-232296
Patent Document 2: Japanese Laid-open Patent Publication No. 2011-211533
Patent Document 3: Japanese Laid-open Patent Publication No. 2002-353744

SUMMARY

An amplifier circuit includes: a first filter that receives input of amplitude information of an input signal, and performs filtering so that a gain of a frequency component higher than a first cutoff frequency becomes greater than a gain of a frequency component lower than the first cutoff frequency; a power supply circuit that has a low-pass filter characteristic that a gain of a frequency component lower than a second cutoff frequency is greater than a gain of a frequency component higher than the second cutoff frequency, and receives input of amplitude information outputted from the first filter and generates a power supply voltage corresponding to the amplitude information outputted from the first filter; an amplifier that receives supply of the power supply voltage generated by the power supply circuit, and amplifies a signal based on the input signal; and a phase difference detector that detects a phase difference between the amplitude information of the input signal and the power supply voltage generated by the power supply circuit, wherein the first filter changes the first cutoff frequency in a direction in which the phase difference detected by the phase difference detector decreases.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 5 is a chart illustrating a simulation result when a deviation occurs between a first cutoff frequency of a first filter and a second cutoff frequency of a power supply circuit;

FIG. 6 is a chart illustrating a phase relationship between amplitude information of an input signal and a power supply voltage generated by the power supply circuit in the case of FIG. 3B;

FIG. 7A is a chart illustrating the case where the first cutoff frequency of the frequency characteristic of the first filter is higher than the second cutoff frequency of the frequency characteristic of the power supply circuit;

FIG. 8B is a chart illustrating a phase relationship between the amplitude information of the input signal and the power supply voltage generated by the power supply circuit in the case of FIG. 8A;

FIG. 14 is a diagram illustrating a configuration example of the first filter in FIG. 3A;

FIG. 15A is a chart illustrating a simulation result of voltage waveforms of the amplitude information and the power supply voltage by feedback control;

FIG. 15B is an enlarged chart of an initial time domain of the feedback control in FIG. 15A;

FIG. 15C is an enlarged chart of a time domain where the feedback control in FIG. 15A has substantially converged;

FIG. 16 is a chart illustrating a simulation result of the voltage change of the control signal of the first filter.

DESCRIPTION OF EMBODIMENTS

First Embodiment

Figure 1:
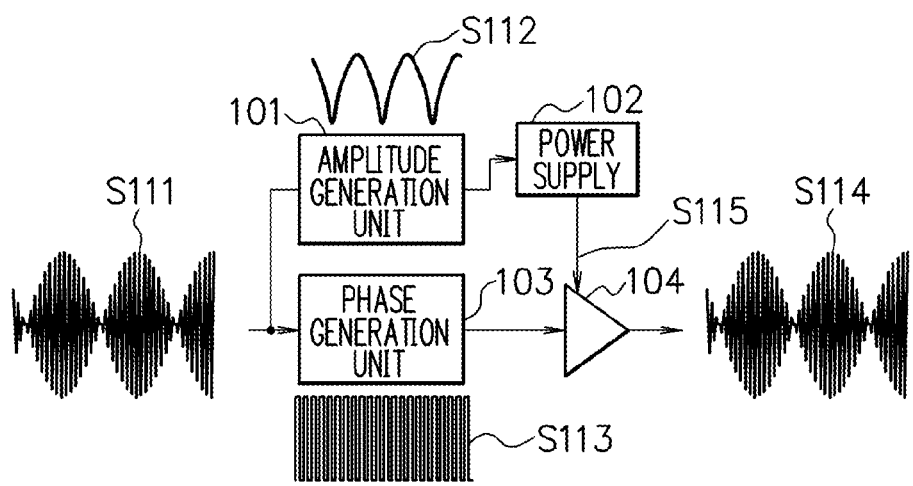
FIG. 1 is a diagram illustrating a configuration example of an amplifier circuit.

FIG. 1 is a diagram illustrating a configuration example of an amplifier circuit. The amplifier circuit includes an amplitude generation unit 101, a power supply circuit 102, a phase generation unit 103, and a switch mode power amplifier 104, and receives input of an input signal S111 and outputs an output signal S114 made by amplifying the input signal S111.

The amplitude generation unit 101 receives input of the input signal S111 and generates amplitude information S112 of the input signal S111. The amplitude information S112 corresponds to an envelope waveform (for example, voltage) of a signal obtained by rectifying the input signal S111. The power supply circuit 102 receives input of the amplitude information S112 and generates a power supply voltage S115 corresponding to the amplitude information S112. The phase generation unit 103 receives input of the input signal S111 and generates phase information S113 of the input signal S111. The input signal S111 is decomposed into the amplitude information S112 and the phase information S113. The switch mode power amplifier 104 receives supply of the power supply voltage S115 generated by the power supply circuit 102, amplifies the phase information S113 by a switching operation of a transistor, and outputs the amplified output signal S114.

As described above, the switch mode power amplifier 104 is capable of amplifying only the phase information S113 because the transistor performs the switching operation, and the amplitude generation unit 101 and the power supply circuit 102 are necessary to amplify the amplitude information S112. The input signal S111 is decomposed into the amplitude information S112 and the phase information S113. The power supply circuit 102 modulates the power supply voltage S115 on the basis of the amplitude information S112. The switch mode power amplifier 104 receives supply of the power supply voltage S115 and amplifies the phase information S113.

Figure 2:
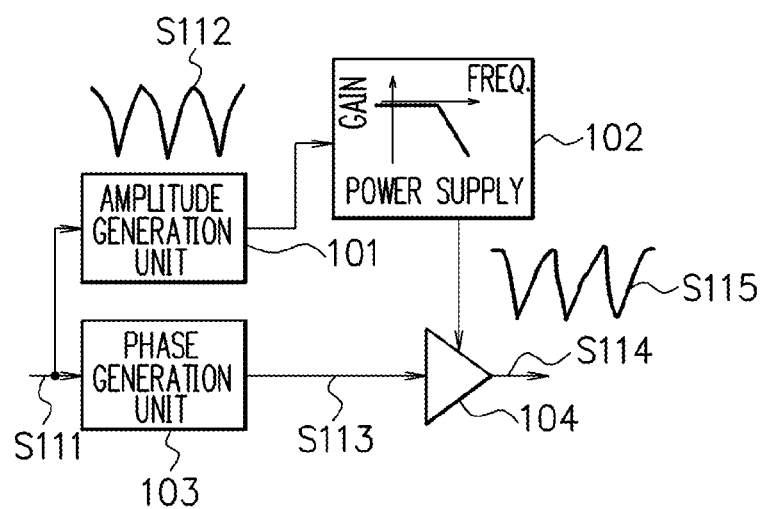
FIG. 2 is a diagram for explaining the problem of the amplifier circuit in FIG. 1.

FIG. 2 is a diagram for explaining the problem of the amplifier circuit in FIG. 1. The power supply circuit 102 has a low-pass filter characteristic that the gain of a frequency component lower than a cutoff frequency is greater than the gain of a frequency component higher than the cutoff frequency. Due to the effect of the low-pass filter characteristic, distortion occurs in the power supply voltage S115. To decrease the distortion of the power supply voltage S115, a high-speed power supply circuit 102 with a high cutoff frequency is necessary. However, the power supply circuit 102 decreases more in power supply voltage generation efficiency as its speed is higher, thus decreasing the total efficiency of the amplifier circuit. Accordingly, an amplifier circuit capable of decreasing the distortion of the power supply voltage S115 while using a low-speed power supply circuit 102 is desired for increasing the efficiency.

Hereinafter, an embodiment capable of decreasing the distortion of the power supply voltage S115 caused by a low-pass filter characteristic of the power supply circuit 102 will be described.

Figure 3A:
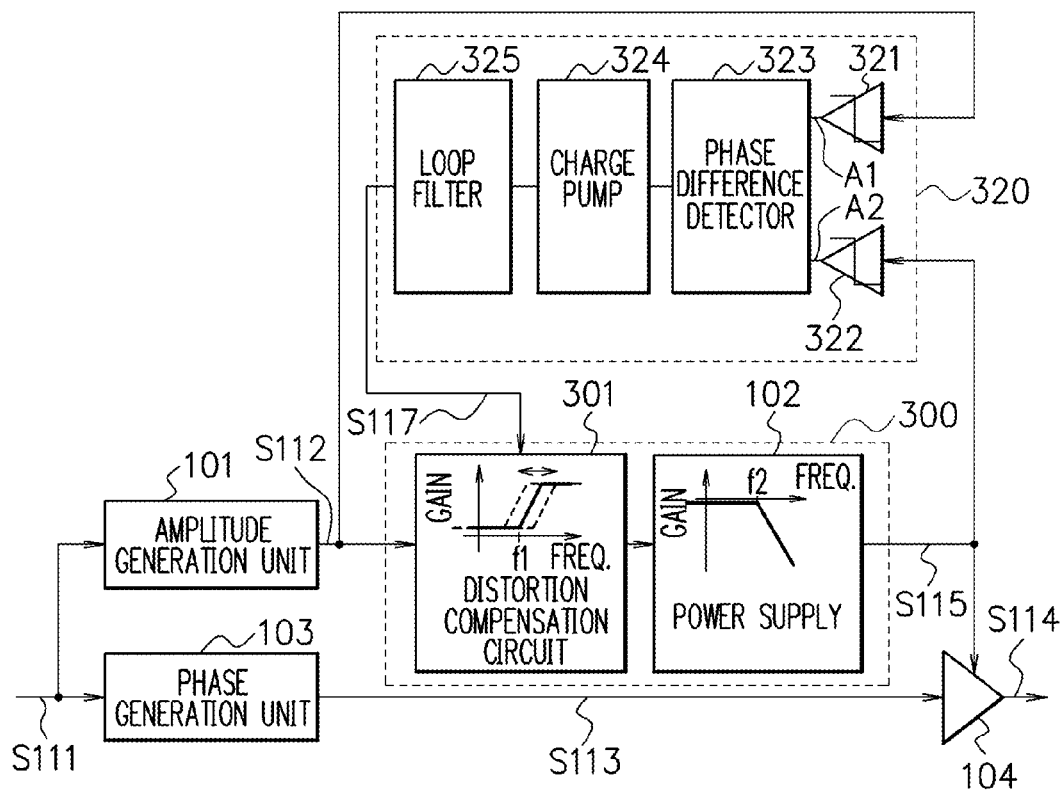
FIG. 3A is a diagram illustrating a configuration example of an amplifier circuit according to a first embodiment.
Figure 3B:
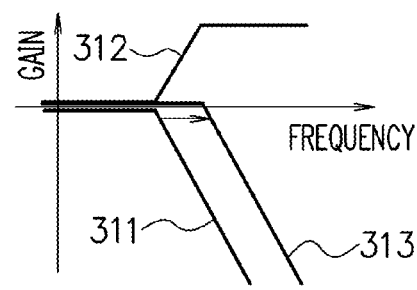
FIG. 3B is a chart illustrating an example of a frequency characteristic of the amplifier circuit in FIG. 3A.

FIG. 3A is a diagram illustrating a configuration example of an amplifier circuit according to a first embodiment, and FIG. 3B is a chart illustrating an example of a frequency characteristic of an amplitude information path (power supply path) of the amplifier circuit in FIG. 3A. The amplifier circuit in FIG. 3A is made by adding a first filter 301 and a control unit 320 to the amplifier circuit in FIG. 1 and FIG. 2. The amplifier circuit has an amplitude generation unit 101, a distortion compensation power supply unit 300, a phase generation unit 103, a switch mode power amplifier 104, and the control unit 320, and receives input of an input signal S111 and outputs an output signal S114 made by amplifying the input signal S111. The distortion compensation power supply unit 300 has the first filter (distortion compensation circuit) 301 and the power supply circuit 102. The control unit 320 has limiters 321, 322, a phase difference detector 323, a charge pump 324, and a loop filter 325.

The amplitude generation unit 101 receives input of the input signal S111 and generates amplitude information S112 of the input signal S111. The amplitude information S112 corresponds to an envelope waveform of a signal obtained by rectifying the input signal S111.

The first filter 301 is a high-pass filter and receives input of the amplitude information S112 of the input signal and performs filtering so that the gain of a frequency component higher than a first cutoff frequency f1 becomes greater than the gain of a frequency component lower than the first cutoff frequency f1, as illustrated by a frequency characteristic 312 in FIG. 3B. For instance, the first filter 301 has a high-pass filter characteristic that the gain increases at the first cutoff frequency f1 or higher. The reason why the gain is constant on the high frequency side in the frequency characteristic 312 in FIG. 3B is because of, for example, a limited band of an operational amplifier constituting the first filter 301. The first filter 301 is preferably a high-pass filter. However, an actual high-pass filter has difficulty in realizing an ideal high-pass filter and thus may have a constant gain on the high frequency side like the frequency characteristic 312 in FIG. 3B.

The power supply circuit 102 has a low-pass filter characteristic that the gain of a frequency component lower than a second cutoff frequency f2 is greater than the gain of a frequency component higher than the second cutoff frequency f2, and receives input of the amplitude information outputted from the first filter 301 and generates a power supply voltage S115 corresponding to the amplitude information outputted from the first filter 301. For instance, the power supply circuit 102 has a low-pass filter characteristic 311 (FIG. 3B) that the gain decreases at the second cutoff frequency f2 or higher.

The first filter 301 is a distortion compensation circuit for decreasing the distortion of the power supply voltage S115 caused by the low-pass filter characteristic of the power supply circuit 102. Hereinafter, the reason why the first filter 301 can decrease the distortion of the power supply voltage S115 will be described. The first cutoff frequency f1 of the frequency characteristic 312 of the first filter 301 is the same or substantially the same as the second cutoff frequency f2 of the power supply circuit 102. Further, the characteristic 312 of the gain to the frequency of the first filter 301 preferably has a slope opposite in positive/negative sign to and having substantially the same absolute value as, in dB (decibel), that of the characteristic 311 of the gain to the frequency of the power supply circuit 102. By combining the frequency characteristic 312 of the first filter 301 and the frequency characteristic 311 of the power supply circuit 102, a frequency characteristic 313 (FIG. 3B) of the power supply voltage S115 becomes high in cutoff frequency as compared with the frequency characteristic 311 of the power supply circuit 102, and its frequency band of a high gain is expanded toward the high frequency side. This makes it possible to decrease the distortion of the power supply voltage S115.

Note that though the case where the gains in a low frequency region of the frequency characteristics 311 and 312 are the same each other is illustrated in FIG. 3B, but the gains may not necessarily be the same.

The phase generation unit 103 has, for example, a limiter circuit and a delay circuit, and receives input of the input signal S111 and generates phase information S113 of the input signal S111. The input signal S111 is decomposed into the amplitude information S112 and the phase information S113. The switch mode power amplifier 104 receives supply of the power supply voltage S115 generated by the power supply circuit 102, amplifies the phase information S113 by a switching operation of a transistor, and outputs the amplified output signal S114.

The switch mode power amplifier 104 is capable of amplifying only the phase information S113 because the transistor performs the switching operation, and the amplitude generation unit 101 and the distortion compensation power supply unit 300 are necessary to amplify the amplitude information S112. The input signal S111 is decomposed into the amplitude information S112 and the phase information S113. The distortion compensation power supply unit 300 modulates the power supply voltage S115 on the basis of the amplitude information S112. The switch mode power amplifier 104 receives supply of the power supply voltage S115 and amplifies the phase information S113.

Figure 4A:
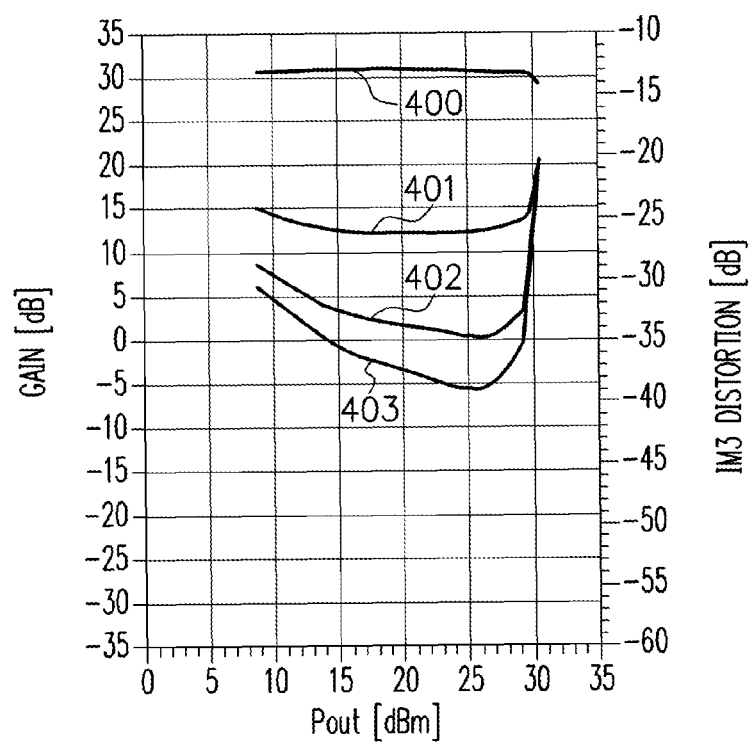
FIG. 4A is a chart illustrating a simulation result of the amplifier circuit in FIG. 1 and FIG. 2.

FIG. 4A is a chart illustrating a simulation result of the amplifier circuit in FIG. 1 and FIG. 2. The horizontal axis indicates the power of the output signal S114, the left vertical axis indicates the gain of the output signal S114, and the right vertical axis indicates the third-order intermodulation distortion amount of the output signal S114. A gain characteristic 400 indicates the gain (left vertical axis) to the power of the output signal S114. Third-order intermodulation distortion amount characteristics 401 to 403 indicate third-order intermodulation distortion amounts (right vertical axis) to the power of the output signal S114. The third-order intermodulation distortion amount characteristic 401 is the characteristic in the case where the second cutoff frequency f2 of the power supply circuit 102 is 5 MHz. The third-order intermodulation distortion amount characteristic 402 is the characteristic in the case where the second cutoff frequency f2 of the power supply circuit 102 is 10 MHz. The third-order intermodulation distortion amount characteristic 403 is the characteristic in the case where the second cutoff frequency f2 of the power supply circuit 102 is 15 MHz. The third-order intermodulation distortion amount is larger as the second cutoff frequency f2 (5 MHz, 10 MHz, 15 MHz) of the power supply circuit 102 is lower.

Figure 4B:
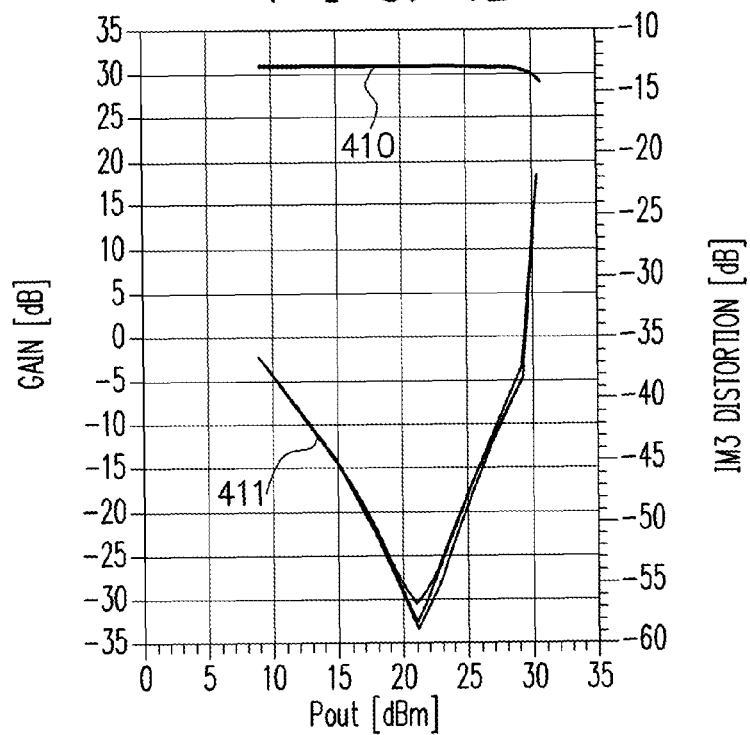
FIG. 4B is a chart illustrating a simulation result of the amplifier circuit in FIG. 3A.

FIG. 4B is a chart illustrating a simulation result of the amplifier circuit in FIG. 3A. The horizontal axis indicates the power of the output signal S114, the left vertical axis indicates the gain of the output signal S114, and the right vertical axis indicates the third-order intermodulation distortion amount of the output signal S114. A gain characteristic 410 indicates the gain (left vertical axis) to the power of the output signal S114. A third-order intermodulation distortion amount characteristic 411 indicates a third-order intermodulation distortion amount (right vertical axis) to the power of the output signal S114, and is the characteristics in the case where the second cutoff frequency f2 of the power supply circuit 102 is 5 MHz, 10 MHz, and 15 MHz, which are substantially the same characteristics. In the case where the second cutoff frequency f2 of the power supply circuit 102 was 5 MHz, the first cutoff frequency f1 of the first filter 301 was set also to 5 MHz. In the case where the second cutoff frequency f2 of the power supply circuit 102 was 10 MHz, the first cutoff frequency f1 of the first filter 301 was set also to 10 MHz. In the case where the second cutoff frequency f2 of the power supply circuit 102 was 15 MHz, the first cutoff frequency f1 of the first filter 301 was set also to 15 MHz. By making the first cutoff frequency f1 and the second cutoff frequency f2 the same, the excellent distortion characteristic 411 with a small distortion amount is exhibited even when the second cutoff frequency f2 of the power supply circuit 102 is low.

The distortion characteristic 411 (FIG. 4B) of the amplifier circuit in FIG. 3A is decreased in distortion amount as compared with the distortion amount characteristics 401 to 403 (FIG. 4A) of the amplifier circuit in FIG. 1 and FIG. 2. According to this embodiment, it is possible to decrease the distortion of the power supply voltage S115 while using the low-speed power supply circuit 102 to increase the efficiency.

In the amplifier circuit in FIG. 3A, the first cutoff frequency f1 of the first filter 301 and the second cutoff frequency f2 of the power supply circuit 102 independently change due to the manufacturing variation, temperature fluctuation and so on. As a result, if deviation occurs between the first cutoff frequency f1 of the first filter 301 and the second cutoff frequency f2 of the power supply circuit 102, the effect of decreasing the distortion of the power supply voltage S115 is weakened.

FIG. 5 is a chart illustrating a simulation result when a deviation occurs between the first cutoff frequency f1 of the first filter 301 and the second cutoff frequency f2 of the power supply circuit 102. The horizontal axis indicates the power of the output signal S114, the left vertical axis indicates the gain of the output signal S114, and the right vertical axis indicates the third-order intermodulation distortion amount of the output signal S114. A gain characteristic 600 indicates the gain (left vertical axis) to the power of the output signal S114.

Third-order intermodulation distortion amount characteristics 601 to 603 indicate third-order intermodulation distortion amounts (right vertical axis) to the power of the output signal S114. The third-order intermodulation distortion amount characteristic 601 is the characteristic in the case where the second cutoff frequency f2 of the power supply circuit 102 is 5 MHz and the first cutoff frequency f1 of the first filter 301 is 10 MHz. The third-order intermodulation distortion amount characteristic 602 is the characteristic in the case where the second cutoff frequency f2 of the power supply circuit 102 is 15 MHz and the first cutoff frequency f1 of the first filter 301 is 10 MHz. The third-order intermodulation distortion amount characteristic 603 is the characteristic in the case where the second cutoff frequency f2 of the power supply circuit 102 is 10 MHz and the first cutoff frequency f1 of the first filter 301 is 10 MHz. It is found that when deviation occurs between the first cutoff frequency f1 of the first filter 301 and the second cutoff frequency f2 of the power supply circuit 102, the distortion amount of the power supply voltage S115 increases.

In the case of FIG. 3B, the first cutoff frequency f1 of the frequency characteristic 312 of the first filter 301 is the same as the second cutoff frequency f2 of the frequency characteristic 311 of the power supply circuit 102. In this case, by combining the frequency characteristic 312 of the first filter 301 and the frequency characteristic 311 of the power supply circuit 102, the frequency characteristic 313 of the power supply voltage S115 becomes high in cutoff frequency as compared with the frequency characteristic 311 of the power supply circuit 102, and its frequency band of a high gain is expanded toward the high frequency side as described above. This state is a state where the effect of decreasing the distortion of the power supply voltage S115 becomes maximum.

FIG. 6 is a chart illustrating a phase relationship between the amplitude information S112 of the input signal and the power supply voltage S115 generated by the power supply circuit 102 in the case of FIG. 3B. The phase difference between the amplitude information S112 of the input signal and the power supply voltage S115 generated by the power supply circuit 102 is 0. The amplitude information S112 is input amplitude information of the distortion compensation power supply unit 300, and the power supply voltage S115 is output amplitude information of the distortion compensation power supply unit 300. In FIG. 3A, the phase difference detector 323 detects that the phase difference between the amplitude information S112 of the input signal and the power supply voltage S115 generated by the power supply circuit 102 is 0 in the case of FIG. 6. In this case, the effect of decreasing the distortion of the power supply voltage S115 is maximum, so that the control unit 320 does not need to change the first cutoff frequency f1 of the first filter 301, and outputs the control signal S117 for keeping the first cutoff frequency f1 to the first filter 301.

FIG. 7A is a chart corresponding to FIG. 3B and illustrating the case where the first cutoff frequency f1 of the frequency characteristic 312 of the first filter 301 is higher than the second cutoff frequency f2 of the frequency characteristic 311 of the power supply circuit 102. In this case, by combining the frequency characteristic 312 of the first filter 301 and the frequency characteristic 311 of the power supply circuit 102, the frequency characteristic 313 of the power supply voltage S115 is greatly affected by the frequency characteristic 311 of the power supply circuit 102, near the first cutoff frequencies f1 and f2, and fails to sufficiently decrease the distortion of the power supply voltage S115.

Figure 7B:
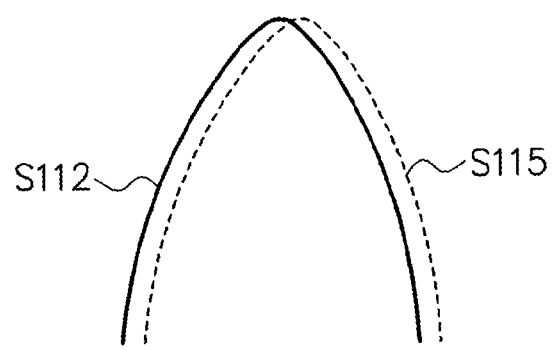
FIG. 7B is a chart illustrating a phase relationship between the amplitude information of the input signal and the power supply voltage generated by the power supply circuit in the case of FIG. 7A.

FIG. 7B is a chart illustrating a phase relationship between the amplitude information S112 of the input signal and the power supply voltage S115 generated by the power supply circuit 102 in the case of FIG. 7A. The phase of the power supply voltage S115 generated by the power supply circuit 102 lags behind the phase of the amplitude information S112 of the input signal. In FIG. 3A, the phase difference detector 323 detects that the phase of the power supply voltage S115 generated by the power supply circuit 102 lags behind the phase of the amplitude information S112 of the input signal in the case of FIG. 7B. In this case, the control unit 320 outputs the control signal S117 to the first filter 301 to decrease the first cutoff frequency f1 of the first filter 301 so as to equalize the first cutoff frequency f1 of the frequency characteristic 312 of the first filter 301 with the second cutoff frequency f2 of the frequency characteristic 311 of the power supply circuit 102. This control makes it possible to increase the effect of decreasing the distortion of the power supply voltage S115.

Figure 8A:
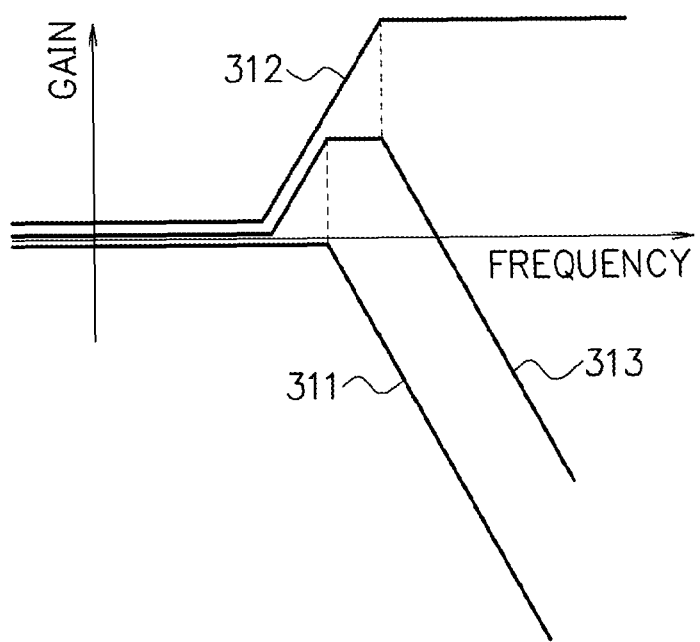
FIG. 8A is a chart illustrating the case where the first cutoff frequency of the frequency characteristic of the first filter is lower than the second cutoff frequency of the frequency characteristic of the power supply circuit.

FIG. 8A is a chart corresponding to FIG. 3B and illustrating the case where the first cutoff frequency f1 of the frequency characteristic 312 of the first filter 301 is lower than the second cutoff frequency f2 of the frequency characteristic 311 of the power supply circuit 102. In this case, by combining the frequency characteristic 312 of the first filter 301 and the frequency characteristic 311 of the power supply circuit 102, the frequency characteristic 313 of the power supply voltage S115 is greatly affected by the frequency characteristic 312 of the first filter 301, near the first cutoff frequencies f1 and f2, and fails to sufficiently decrease the distortion of the power supply voltage S115.

FIG. 8B is a chart illustrating a phase relationship between the amplitude information S112 of the input signal and the power supply voltage S115 generated by the power supply circuit 102 in the case of FIG. 8A. The phase of the power supply voltage S115 generated by the power supply circuit 102 leads the phase of the amplitude information S112 of the input signal. In FIG. 3A, the phase difference detector 323 detects that the phase of the power supply voltage S115 generated by the power supply circuit 102 leads the phase of the amplitude information S112 of the input signal in the case of FIG. 8B. In this case, the control unit 320 outputs the control signal S117 to the first filter 301 to increase the first cutoff frequency f1 of the first filter 301 so as to equalize the first cutoff frequency f1 of the frequency characteristic 312 of the first filter 301 with the second cutoff frequency f2 of the frequency characteristic 311 of the power supply circuit 102. This control makes it possible to increase the effect of decreasing the distortion of the power supply voltage S115.

Figure 9:
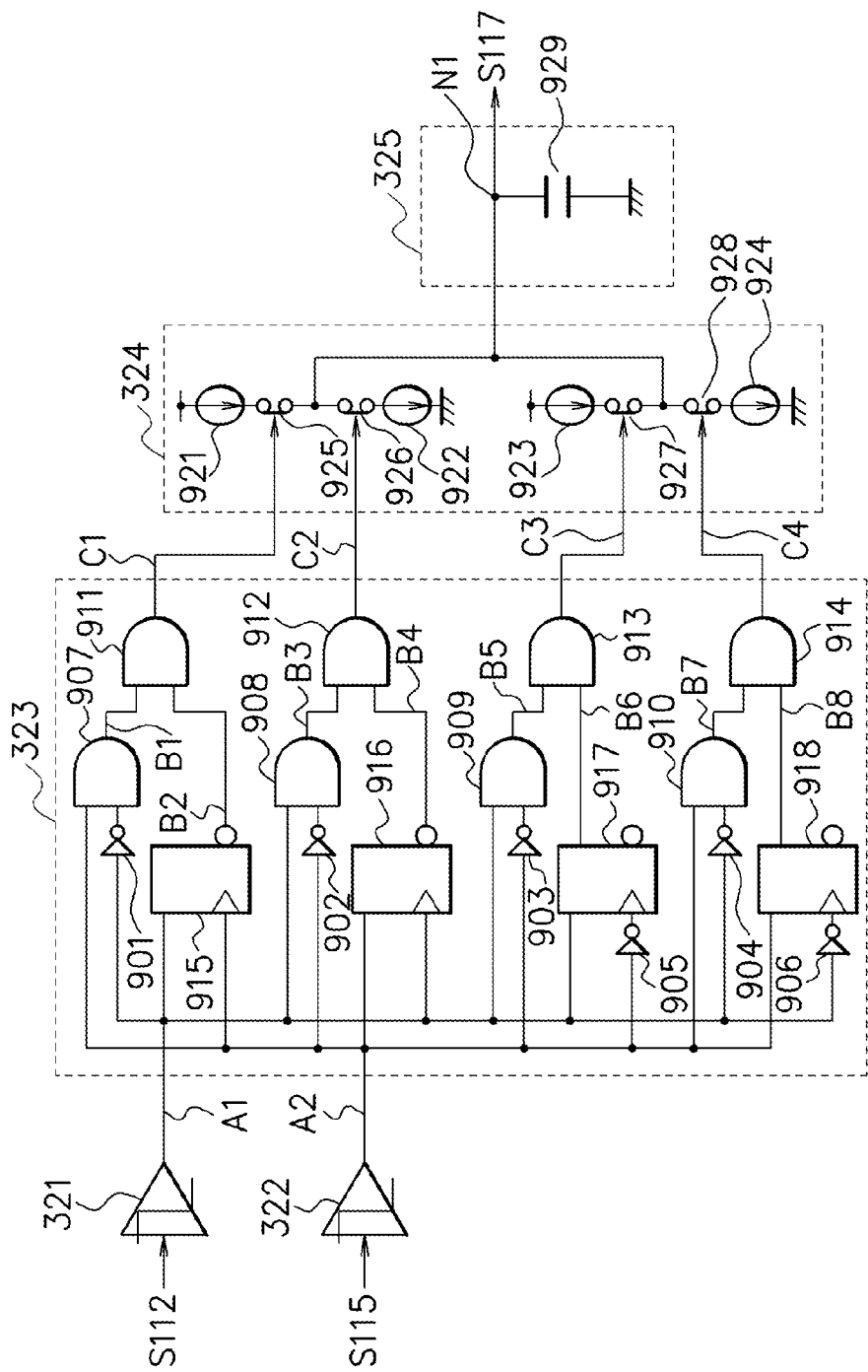
FIG. 9 is a diagram illustrating a configuration example of a control unit in FIG. 3A.

FIG. 9 is a diagram illustrating a configuration example of the control unit 320 in FIG. 3A. The control unit 320 has the limiters 321, 322, the phase difference detector 323, the charge pump 324, and the loop filter 325.

The limiter 321 amplifies the amplitude information S112 of the input signal, limits a potential equal to or higher than a high level to the high level and limits a potential equal to or lower than a low level to the low level, and outputs amplitude information A1. For example, the high level is a power supply potential and the low level is a ground potential. In other words, the limiter 321 converts analog amplitude information S112 into binary digital amplitude information A1.

Similarly, the limiter 322 amplifies the power supply voltage S115 generated by the power supply circuit 102, limits a potential equal to or higher than a high level to the high level and limits a potential equal to or lower than a low level to the low level, and outputs a power supply voltage A2. In other words, the limiter 322 converts analog power supply voltage S115 into binary digital power supply voltage A2.

The phase difference detector 323 has inverters 901 to 906, logical product (AND) circuits 907 to 914, and flip-flops 915 to 918. The charge pump 324 has current sources 921 to 924 and switches 925 to 928. The loop filter 325 has a capacitor 929. The capacitor 929 is connected between an output node N1 and a ground potential node. A control signal S117 is outputted from the output node N1.

Figure 10:
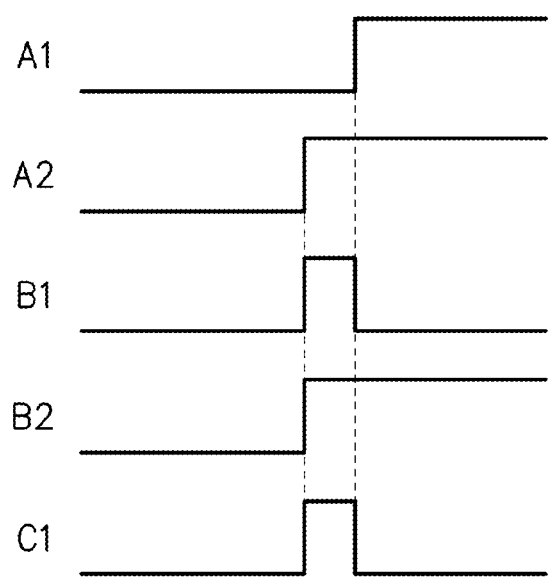
FIG. 10 is a timing chart for explaining the operation of a phase difference detector when a rising edge of the power supply voltage leads a rising edge of the amplitude information.

FIG. 10 is a timing chart for explaining the operation of the phase difference detector 323 (FIG. 9) when the rising edge of the power supply voltage A2 leads the rising edge of the amplitude information A1. The inverter 901 outputs a signal obtained by logically inverting the amplitude information A1. The logical product circuit 907 outputs a logical product signal B1 of the output signal of the inverter 901 and the power supply voltage A2. The flip-flop 915 inverts the level (for example, low level) of the amplitude information A1 at the rising time of the power supply voltage A2, and holds and outputs a signal B2 at the inverted level (for example, high level). The logical product circuit 911 outputs a logical product signal C1 of the signal B1 and the signal B2. In this case, the first logical product circuit 911 outputs a leading pulse signal as the logical product signal C1, and the second to fourth logical product circuits 912 to 914 output low level signals as logical product signals C2 to C4. The pulse width of the leading pulse signal corresponds to the phase difference between the amplitude information S112 and the power supply voltage S115.

Then, in FIG. 9, the switch 925 turns on and the switches 926 to 928 turn off. The output node N1 is connected to the power supply potential node via the current source 921 and electric charges are charged in the capacitor 929. Then, the voltage of the control signal S117 increases. Further, the control signal S117 is suppressed in high frequency component by the loop filter 325. When the voltage of the control signal S117 increases, the first filter 301 in FIG. 3A increases in the first cutoff frequency f1. This decreases the difference between the first cutoff frequency f1 of the first filter 301 and the second cutoff frequency f2 of the power supply circuit 102, thereby making it possible to increase the effect of decreasing the distortion of the power supply voltage S115.

Figure 11:
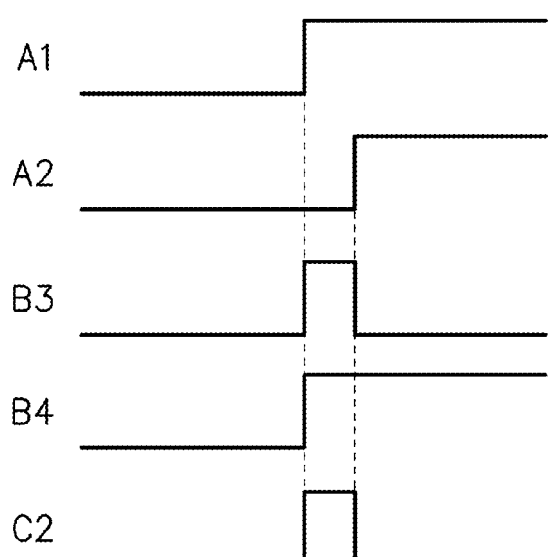
FIG. 11 is a timing chart for explaining the operation of the phase difference detector when the rising edge of the power supply voltage lags behind the rising edge of the amplitude information.

FIG. 11 is a timing chart for explaining the operation of the phase difference detector 323 (FIG. 9) when the rising edge of the power supply voltage A2 lags behind the rising edge of the amplitude information A1. The inverter 902 outputs a signal obtained by logically inverting the power supply voltage A2. The logical product circuit 908 outputs a logical product signal B3 of the output signal of the inverter 902 and the amplitude information A1. The flip-flop 916 inverts the level (for example, low level) of the power supply voltage A2 at the rising time of the amplitude information A1, and holds and outputs a signal B4 at the inverted level (for example, high level). The logical product circuit 912 outputs the logical product signal C2 of the signal B3 and the signal B4. In this case, the second logical product circuit 912 outputs a lagging pulse signal as the logical product signal C2, and the first, third, and fourth logical product circuits 911, 913, 914 output low level signals as the logical product signals C1, C3, C4. The pulse width of the lagging pulse signal corresponds to the phase difference between the amplitude information S112 and the power supply voltage S115.

Then, in FIG. 9, the switch 926 turns on and the switches 925, 927, 928 turn off. The output node N1 is connected to the ground potential node via the current source 922 and the electric charges in the capacitor 929 are discharged. Then, the voltage of the control signal S117 decreases. Further, the control signal S117 is suppressed in high frequency component by the loop filter 325. When the voltage of the control signal S117 decreases, the first filter 301 in FIG. 3A decreases in the first cutoff frequency f1. This decreases the difference between the first cutoff frequency f1 of the first filter 301 and the second cutoff frequency f2 of the power supply circuit 102, thereby making it possible to increase the effect of decreasing the distortion of the power supply voltage S115.

Figure 12:
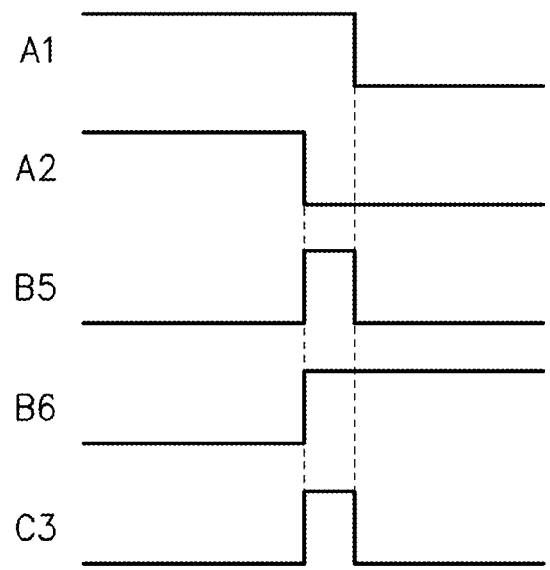
FIG. 12 is a timing chart for explaining the operation of the phase difference detector when a falling edge of the power supply voltage leads a falling edge of the amplitude information.

FIG. 12 is a timing chart for explaining the operation of the phase difference detector 323 (FIG. 9) when the falling edge of the power supply voltage A2 leads the falling edge of the amplitude information A1. The inverter 903 outputs a signal obtained by logically inverting the power supply voltage A2. The logical product circuit 909 outputs a logical product signal B5 of the output signal of the inverter 903 and the amplitude information A1. The inverter 905 outputs a signal obtained by logically inverting the power supply voltage A2 to a clock terminal of the flip-flop 917. The flip-flop 917 holds and outputs a signal B6 at the level (for example, high level) of the amplitude information A1 at the falling time of the power supply voltage A2. The logical product circuit 913 outputs the logical product signal C3 of the signal B5 and the signal B6. In this case, the third logical product circuit 913 outputs a leading pulse signal as the logical product signal C3, and the first, second, and fourth logical product circuits 911, 912, 914 output low level signals as the logical product signals C1, C2, C4. The pulse width of the leading pulse signal corresponds to the phase difference between the amplitude information S112 and the power supply voltage S115.

Then, in FIG. 9, the switch 927 turns on and the switches 925, 926, 928 turn off. The output node N1 is connected to the power supply potential node via the current source 923 and electric charges are charged in the capacitor 929. Then, the voltage of the control signal S117 increases. Further, the control signal S117 is suppressed in high frequency component by the loop filter 325. When the voltage of the control signal S117 increases, the first filter 301 in FIG. 3A increases in the first cutoff frequency f1. This decreases the difference between the first cutoff frequency f1 of the first filter 301 and the second cutoff frequency f2 of the power supply circuit 102, thereby making it possible to increase the effect of decreasing the distortion of the power supply voltage S115.

Figure 13:
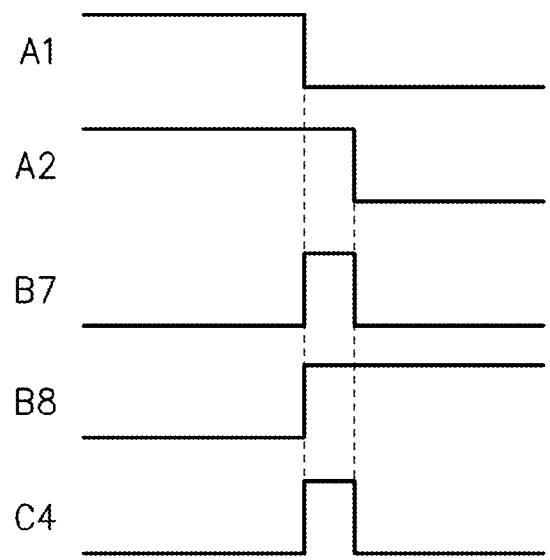
FIG. 13 is a timing chart for explaining the operation of the phase difference detector when the falling edge of the power supply voltage lags behind the falling edge of the amplitude information.

FIG. 13 is a timing chart for explaining the operation of the phase difference detector 323 (FIG. 9) when the falling edge of the power supply voltage A2 lags behind the falling edge of the amplitude information A1. The inverter 904 outputs a signal obtained by logically inverting the amplitude information A1. The logical product circuit 910 outputs a logical product signal B7 of the output signal of the inverter 904 and the power supply voltage A2. The inverter 906 outputs a signal obtained by logically inverting the amplitude information A1 to a clock terminal of the flip-flop 918. The flip-flop 918 holds and outputs a signal B8 at the level (for example, high level) of the power supply voltage A2 at the falling time of the amplitude information A1. The logical product circuit 914 outputs the logical product signal C4 of the signal B7 and the signal B8. In this case, the fourth logical product circuit 914 outputs a lagging pulse signal as the logical product signal C4, and the first to third logical product circuits 911 to 913 output low level signals as the logical product signals C1 to C3. The pulse width of the lagging pulse signal corresponds to the phase difference between the amplitude information S112 and the power supply voltage S115.

Then, in FIG. 9, the switch 928 turns on and the switches 925 to 927 turn off. The output node N1 is connected to the ground potential node via the current source 924 and the electric charges in the capacitor 929 are discharged. Then, the voltage of the control signal S117 decreases. Further, the control signal S117 is suppressed in high frequency component by the loop filter 325. When the voltage of the control signal S117 decreases, the first filter 301 in FIG. 3A decreases in the first cutoff frequency f1. This decreases the difference between the first cutoff frequency f1 of the first filter 301 and the second cutoff frequency f2 of the power supply circuit 102, thereby making it possible to increase the effect of decreasing the distortion of the power supply voltage S115.

As in the above manner, the phase difference detector 323 detects the phase difference between the amplitude information S112 of the input signal and the power supply voltage S115 generated by the power supply circuit 102. The first filter 301 changes the first cutoff frequency f1 in a direction in which the phase difference detected by the phase difference detector 323 decreases. The first filter 301 is feedback-controlled by the control unit 320.

The loop filter 325 has the capacitor 929 for accumulating electric charges. The charge pump 324 causes the loop filter 325 to charge or discharge electric charges according to a positive/negative sign of the phase difference detected by the phase difference detector 323. When the power supply voltage S115 leads the amplitude information S112, the phase difference becomes a negative value, so that electric charges are charged in the loop filter 325 as illustrated in FIG. 10 and FIG. 12. In contrast, when the power supply voltage S115 lags behind the amplitude information S112, the phase difference becomes a positive value, so that the electric charges in the loop filter 325 are discharged as illustrated in FIG. 11 and FIG. 13. The first filter 301 changes the first cutoff frequency f1 according to the amount of the electric charges accumulated in the loop filter 325.

FIG. 14 is a diagram illustrating a configuration example of the first filter 301 in FIG. 3A. The first filter 301 has capacitors 1101, 1102, n-channel MOS field effect transistors 1103, 1104, 1106, 1107, and a differential amplifier 1105, and receives input of differential signals S112p and S112n from the amplitude generation unit 101 and outputs differential signals S116p and S116n to the power supply circuit 102. The differential signals S112p and S112n correspond to the amplitude information S112 in FIG. 3A.

The first filter 301 is a MOS-C active filter (first-order high-pass filter) made by replacing the resistors of an RC active filter with the MOS transistors 1103, 1104, 1106, 1107. The first filter 301 is configured such that the on-resistances of the MOS transistors 1103, 1104, 1106, 1107 are made variable by controlling the gate voltages of the MOS transistors 1103, 1104, 1106, 1107 by the control signal S117. As a result, the first cutoff frequency f1 decided by the on-resistances of the MOS transistors 1103, 1104, 1106, 1107 and the capacitors 1101, 1102 can be made variable. When the voltage of the control signal S117 increases, the on-resistances of the MOS transistors 1103, 1104, 1106, 1107 decrease and the first cutoff frequency f1 increases. In contrast to this, when the voltage of the control signal S117 decreases, the on-resistances of the MOS transistors 1103, 1104, 1106, 1107 increase and the first cutoff frequency f1 decreases.

Though the first-order high-pass filter has been described as an example in FIG. 14, the order of the high-pass filter characteristic of the first filter 301 and its frequency characteristic are not limited to those of the first-order high-pass filter but are preferably selected according to the frequency characteristic of the power supply circuit 102 so as to obtain a suitable distortion compensation characteristic of the amplifier circuit. Further, the example where the MOS transistors 1103, 1104, 1106, 1107 are n-channel MOS transistors has been described, but they may be p-channel MOS transistors. In this case, the positive/negative sign of the voltage of the control signal S117 is inverted.

FIG. 15A is a chart illustrating a simulation result of voltage waveforms of the amplitude information S112 and the power supply voltage S115 by the feedback control. The horizontal axis indicates time, and the vertical axis indicates voltage. Since FIG. 15A is a reduced chart, the waveforms of the amplitude information S112 and the power supply voltage S115 are substantially the same on FIG. 15A.

FIG. 15B is an enlarged chart of an initial time domain 1501 of the feedback control in FIG. 15A. In the initial time domain 1501 of the feedback control, the power supply voltage S115 lags behind the amplitude information S112 by a time T1. The time T1 is 3.5 ns.

FIG. 15C is an enlarged chart of a time domain 1502 where the feedback control in FIG. 15A has substantially converged. In the time domain 1502 where the feedback control has substantially converged, the power supply voltage S115 lags behind the amplitude information S112 by a time T2. The time T2 is 0.7 ns and is thus shorter than the time T1 (3.5 ns) in FIG. 15B.

FIG. 16 is a chart corresponding to FIG. 15A and illustrating a simulation result of the voltage change of the control signal S117 of the first filter 301. The horizontal axis indicates time, and the vertical axis indicates voltage. The state that the control signal S117 converges with time by the feedback control is illustrated.

As described above, the delay time of the power supply voltage S115 with respect to the amplitude information S112 is reduced by the feedback control from the time T1 (3.5 ns) to the time T2 (0.7 ns). It is found that the delay time T1 is long in an un-converged state but the delay time T2 is reduced as it gets closer to convergence. When the delay time is reduced, the difference between the first cutoff frequency f1 and the second cutoff frequency f2 is decreased to increase the effect of decreasing the distortion of the power supply voltage S115.

Second Embodiment

Figure 17:
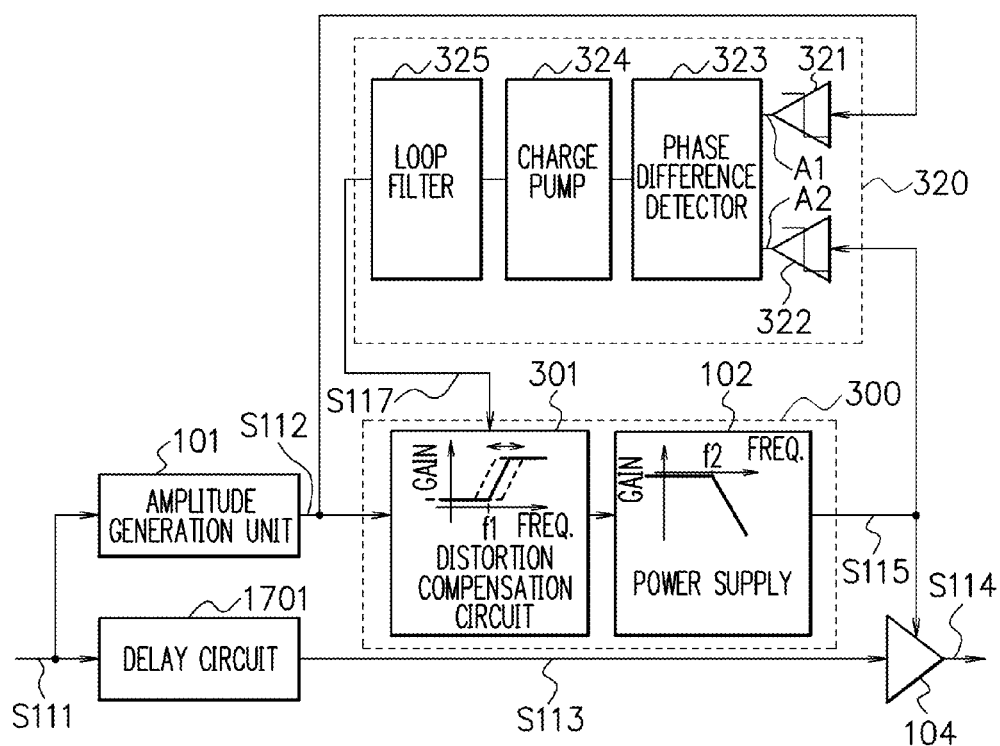
FIG. 17 is a diagram illustrating a configuration example of an amplifier circuit according to a second embodiment.

FIG. 17 is a diagram illustrating a configuration example of an amplifier circuit according to a second embodiment. In the first embodiment (FIG. 3A), the amplifier circuit using the switch mode power amplifier 104 has been described. In contrast, in the second embodiment (FIG. 17), an amplifier circuit using a linear mode power amplifier 104 will be described. Hereinafter, the points of this embodiment different from the first embodiment will be described. A delay circuit 1701 is provided in place of the phase generation unit 103 in FIG. 3A. The delay circuit 1701 receives input of an input signal S111, delays the input signal S111, and outputs a delayed signal S113. The linear mode power amplifier 104 receives supply of a power supply voltage S115 generated by a power supply circuit 102, linearly amplifies the input signal S113 delayed by the delay circuit 1701, and outputs an amplified output signal S114. The delay circuit 1701 can adjust the timings of the delay signal S113 and the power supply voltage S115.

The switch mode power amplifier 104 in the first embodiment is ideally higher in power efficiency than the linear mode power amplifier 104 in the second embodiment. This is ideally because no drain current flows in a period when a voltage is applied to the drain of a transistor in the switch mode power amplifier 104, whereas no drain voltage is applied in a period when the drain current flows, so that power consumption=drain voltage×drain current=0.

As described above, according to the first and second embodiments, provision of the first filter 301 makes it possible to decrease the distortion due to the low-pass filter characteristic of the power supply circuit 102 even by using a power supply circuit 102 which is excellent in power supply efficiency and low in speed. Further, provision of the control unit 320 makes it possible to improve the effect of decreasing the distortion.

Note that the above-described embodiments merely illustrate concrete examples of implementing the present invention, and the technical scope of the present invention is not to be construed in a restrictive manner by these embodiments. That is, the present invention may be implemented in various forms without departing from the technical spirit or main features thereof.

Provision of a first filter makes it possible to decrease a distortion due to a low-pass filter characteristic of a power supply circuit. Further, provision of a phase difference detector makes it possible to improve the effect of decreasing the distortion.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An amplifier circuit comprising:
   a first filter that receives input of amplitude information of an input signal, and performs filtering so that a gain of a frequency component higher than a first cutoff frequency becomes greater than a gain of a frequency component lower than the first cutoff frequency;
   a power supply circuit that has a low-pass filter characteristic that a gain of a frequency component lower than a second cutoff frequency is greater than a gain of a frequency component higher than the second cutoff frequency, and receives input of amplitude information outputted from the first filter and generates a power supply voltage corresponding to the amplitude information outputted from the first filter;
   an amplifier that receives supply of the power supply voltage generated by the power supply circuit, and amplifies a signal based on the input signal; and
   a phase difference detector that detects a phase difference between the amplitude information of the input signal and the power supply voltage generated by the power supply circuit,
   wherein the first filter changes the first cutoff frequency in a direction in which the phase difference detected by the phase difference detector decreases.

2. The amplifier circuit according to claim 1, further comprising:
   a loop filter that accumulates electric charges; and
   a charge pump that causes the loop filter to charge or discharge electric charges according to a positive/negative sign of the phase difference detected by the phase difference detector,
   wherein the first filter changes the first cutoff frequency according to an amount of electric charges accumulated in the loop filter.

3. The amplifier circuit according to claim 1, wherein the phase difference detector comprises:
   a first logic circuit that generates a leading pulse signal when a rising edge of the power supply voltage generated by the power supply circuit leads a rising edge of the amplitude information of the input signal;
   a second logic circuit that generates a lagging pulse signal when the rising edge of the power supply voltage generated by the power supply circuit lags behind the rising edge of the amplitude information of the input signal;
   a third logic circuit that generates a leading pulse signal when a falling edge of the power supply voltage generated by the power supply circuit leads a falling edge of the amplitude information of the input signal; and
   a fourth logic circuit that generates a lagging pulse signal when the falling edge of the power supply voltage generated by the power supply circuit lags behind the falling edge of the amplitude information of the input signal.

4. The amplifier circuit according to claim 1, wherein the first filter is a high-pass filter.

5. The amplifier circuit according to claim 1, wherein the first cutoff frequency is substantially the same as the second cutoff frequency.

6. The amplifier circuit according to claim 1, wherein the characteristic of the gain to the frequency of the first filter has a slope opposite in positive/negative sign to and having substantially the same absolute value as, in dB (decibel), a slope of the characteristic of the gain to the frequency of the power supply circuit.

7. The amplifier circuit according to claim 1, further comprising:
   an amplitude generation unit that receives input of the input signal and generates the amplitude information of the input signal; and
   a phase generation unit that receives input of the input signal and generates phase information of the input signal,
   wherein the first filter receives input of the amplitude information of the input signal generated by the amplitude generation unit, and
   wherein the amplifier amplifies the phase information of the input signal generated by the phase generation unit.

8. The amplifier circuit according to claim 1, further comprising:
   an amplitude generation unit that receives input of the input signal and generates the amplitude information of the input signal; and
   a delay circuit that receives input of the input signal and delays the input signal,
   wherein the first filter receives input of the amplitude information of the input signal generated by the amplitude generation unit, and
   wherein the amplifier amplifies the input signal delayed by the delay circuit.

* * * * *